United States Patent
Nering

[11] Patent Number: 6,050,891
[45] Date of Patent: Apr. 18, 2000

[54] VACUUM PROCESSING SYSTEM WITH TURBO-AXIAL FAN IN CLEAN-AIR SUPPLY SYSTEM OF FRONT END ENVIRONMENT

[75] Inventor: Eric A. Nering, Modesto, Calif.

[73] Assignee: Applied Materials, Inc., Santa Clara, Calif.

[21] Appl. No.: 09/019,610

[22] Filed: Feb. 6, 1998

[51] Int. Cl.⁷ .................................................. H01L 21/00

[52] U.S. Cl. ......................... 454/187; 55/385.2; 414/939; 454/192

[58] Field of Search .................................. 454/187, 188, 454/192; 55/385.2, 467, 470, 471, 473; 414/939

[56] References Cited

U.S. PATENT DOCUMENTS

| | | | |
|---|---|---|---|
| 4,102,656 | 7/1978 | Koritz | 55/473 X |
| 4,986,170 | 1/1991 | Ramakrishnan et al. | 454/906 X |
| 5,003,865 | 4/1991 | Traudt . | |
| 5,642,978 | 7/1997 | Lahne et al. | 414/937 X |
| 5,922,095 | 7/1999 | Hustvedt et al. | 55/385.2 X |

*Primary Examiner*—Harold Joyce
*Attorney, Agent, or Firm*—Thomason Moser & Patterson

[57] ABSTRACT

A turbo-axial fan assembly is provided for a clean-air supply system of a substrate handling module of a vacuum processing system. The turbo-axial fan assembly has one or more turbo-axial fans for generating airflow through the substrate handling environment. The turbo-axial fans have tunable vanes for controlling the speed of the airflow and efficiently using the available power.

15 Claims, 5 Drawing Sheets

VACUUM PROCESSING SYSTEM WITH TURBO-AXIAL FAN IN CLEAN-AIR SUPPLY SYSTEM OF FRONT END ENVIRONMENT

FIELD OF THE INVENTION

The present invention generally relates to systems for processing substrates typically used in the fabrication of integrated circuits and flat panel displays. Specifically, the invention relates to the airflow mechanism for a clean-air supply system of a substrate handling chamber in a processing system.

BACKGROUND OF THE INVENTION

Vacuum processing systems for processing 100 mm, 200 mm, 300 mm or other diameter substrates are generally known. Typically, such vacuum processing systems have a centralized transfer chamber mounted on a monolith platform. The transfer chamber is the center of activity for the movement of substrates being processed in the system. One or more process chambers attach to the transfer chamber for performing one or more of a variety of different processes on the substrates. Access to the transfer chamber for substrates from the exterior of the system, or from the manufacturing facility, is typically through one or more load lock chambers. The load lock chambers cycle between the pressure level of the ambient environment and the pressure level in the transfer chamber in order for the substrates to be passed therebetween. The load lock chambers attach to a substrate transfer chamber, referred to herein as a mini-environment, which handles, or transfers, substrates in a very clean environment at atmospheric pressure from substrate pods to the load lock chambers. The interiors of each of these chambers must be maintained very clean so as not to contaminate or damage the substrates that pass therethrough.

FIGS. 2 and 3 generally show a vacuum processing system 100 having a mini-environment 120 with a clean-air supply system 200 disposed on the top of the mini-environment 120. The mini-environment 120 has a substrate handler 128 that transfers substrates 156 from substrate cassettes 154 supported on load ports 122 to load lock chambers 118. If airborne particles, or contaminants, deposit on the substrates during handling in the mini-environment, then the integrity of devices formed by the processes that the substrates are to undergo may be adversely affected. In order to maintain the cleanliness of the mini-environment, highly filtered air is continuously flowed therethrough. A clean-air supply system, typically disposed on the top of the mini-environment, has a scroll-type centrifugal fan assembly generating airflow through a high efficiency particle filter. The filtered air flows downward to remove, by airflow and gravity, any airborne particles that may have entered the mini-environment or have been shed from internal surfaces or devices.

The prior art for the clean-air supply system 200 uses a single centrifugal fan assembly 10, such as that shown in the side and top views of FIGS. 1a and 1b, respectively, to flow highly filtered air generally downward in the direction of arrows F–H. The filtered air flows out through exit vents 202 arranged in the bottom of the mini-environment 120.

The centrifugal fan assembly 10 has a motor 12 mounted on supports 14 with a drive shaft 16 connected to a squirrel-cage fan 18 to rotate the fan 18. The fan 18 mounts inside a fan housing 20 and rotates in the direction of arrow D to generate airflow through to an inlet plenum 22 and into a filter plenum 24 where the airflow is spread out and redirected downward through a high-efficiency particle filter 26 and into the mini-environment 120. A continuous flow of air by the fan assembly 10 ensures that the air in the mini-environment 120 will be maintained in a very clean condition.

A problem with the prior art clean-air supply systems 10 is that centrifugal fans do not provide an efficient means to control the speed of the airflow through the mini-environment 120. It is necessary to vary the airflow rate in the mini-environment 120 at various times in the operation of the processing system 100. Occasionally, the airflow rate must be increased to more quickly remove particles from the mini-environment, such as at start-up of a new system 100 since a relatively large number of particles may have accumulated in the mini-environment 120 by that time, or to prevent particles from entering the mini-environment, such as when opening or closing load port doors 123 so contaminated air from outside the mini-environment 120 or particles generated by the movement of the doors 123 do not enter the mini-environment 120. Thus, a high airflow rate is needed for rapid clean-up of the mini-environment 120, but it is also used to test the integrity of the seals of the mini-environment 120, by providing positive pressure inside the mini-environment 120 which may cause a detectable air-jet at a leakage point in any of the seals, and to measure the air pressure drop across the filter, whereby an unacceptably high pressure drop indicates that the filter has collected too many entrained particles to continue functioning properly and needs to be replaced. A high airflow rate, however, means a high fan speed, which causes unwanted noise in the manufacturing facility, draws significantly more electrical power than at slower speeds and shortens the useful life of the filter. It is desirable, therefore, to slow the fan speed down whenever possible to reduce noise, conserve energy and lengthen the life of the filter. Thus, when no substrates are being passed through the mini-environment 120 or the system 100 is otherwise in a standby mode, or waiting, it is preferable to reduce the fan speed and the airflow rate. The fan assembly 10 is rarely turned completely off, however, since the number of particles may build up inside the mini-environment 120 while the air therein is still, so the fan assembly 10 is typically maintained at least at a minimal speed. Additionally, the fan assembly 10 may be operated at an intermediate level at times, such as when substrates are being moved through the mini-environment 120, and it is not necessary to flow the air very fast, but it is desired to maintain the level of cleanliness fairly high in the mini-environment 120.

One prior art means to control the airflow speed has been to vary the axial speed of the centrifugal fan 18. The most often used means to vary the fan speed has been to incorporate an electronic variable speed fan control unit. Reducing the axial speed of the fan 18, even though the power consumed by the fan assembly 10 may be less, can still result in power losses, since the fan assembly 18 is typically rated to operate at a particular power level, the fan assembly 18 inefficiently uses the available power at lower power levels. An additional issue with using variable speed fan control units is that for the relatively small units typically needed in a mini-environment, the electronics have electrical noise and heat dissipation issues that do not meet European CE EMC requirements. These units typically moot U.S. standards, but not European requirements. Thus, although a manufacturer of processing systems 100 and/or mini-environments 120 may prefer to build one type of system 100 with only one mini-environment 120 using only one type of clean-air supply system 200 for all customers in all countries, the standards requirements of some countries makes such a preference impossible or costly.

Another prior art means to control the airflow speed has been to partially close off the airflow through the fan assembly 10 by means of a damper. In this manner, the fan assembly 10 always operates at the same speed, but the damper partially blocks the airflow passageway into or out of the fan assembly 10. A damper in the airflow, however, merely causes the fan assembly 10 to generate airflow against the damper and lose part of the air pressure that it generates. Thus, a damped clean-air supply system 200 wastes energy, due to the intentional loss of airflow.

Therefore, a need exists for a processing system with a mini-environment and a clean-air supply system that can vary the airflow through the mini-environment while efficiently using the power available to its airflow mechanism and easily meeting world market standards for electrical noise and thermal dissipation.

SUMMARY OF THE INVENTION

A vacuum processing system has a substrate handling environment, or mini-environment, with a clean-air supply system having one or more turbo-axial fan assemblies for providing airflow through a high efficiency particle filter and through the substrate handling environment. The turbo-axial fans include adjustable fan blades, or vanes, for varying the pitch of the vanes to control the volume of the airflow. A turbo-axial fan with variable, or tunable, vanes maintains the quality of its available power and efficiently uses the power. The fan rotates at essentially the same axial speed while changing the vane pitch from high to low to change the airflow from fast to slow. The pitch of the vanes may be altered to generate an airflow at any rate within a range from its maximum rate to its minimum rate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF A PREFERRED EMBODIMENT

The clean-air supply system described below provides for a greater efficiency in electrical power usage than does the prior art. In addition, the clean-air supply system easily meets the codes or regulations for EM emissions for every significant country or region.

Figure 1A:
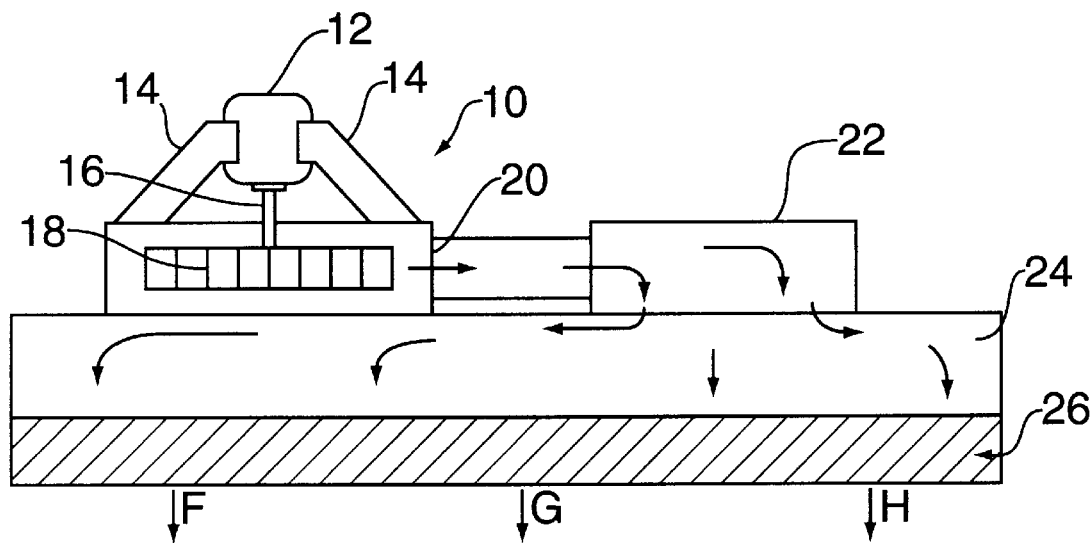
FIG. 1a is a side view of a centrifugal fan used in a prior art clean-air supply system.
Figure 1B:
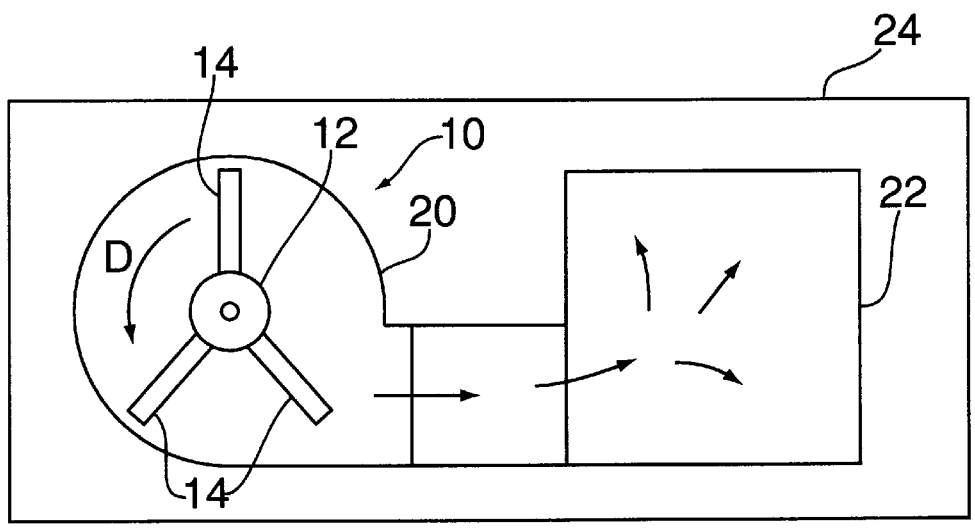
FIG. 1b is a top view of a centrifugal fan used in a prior art clean-air supply system.
Figure 2:
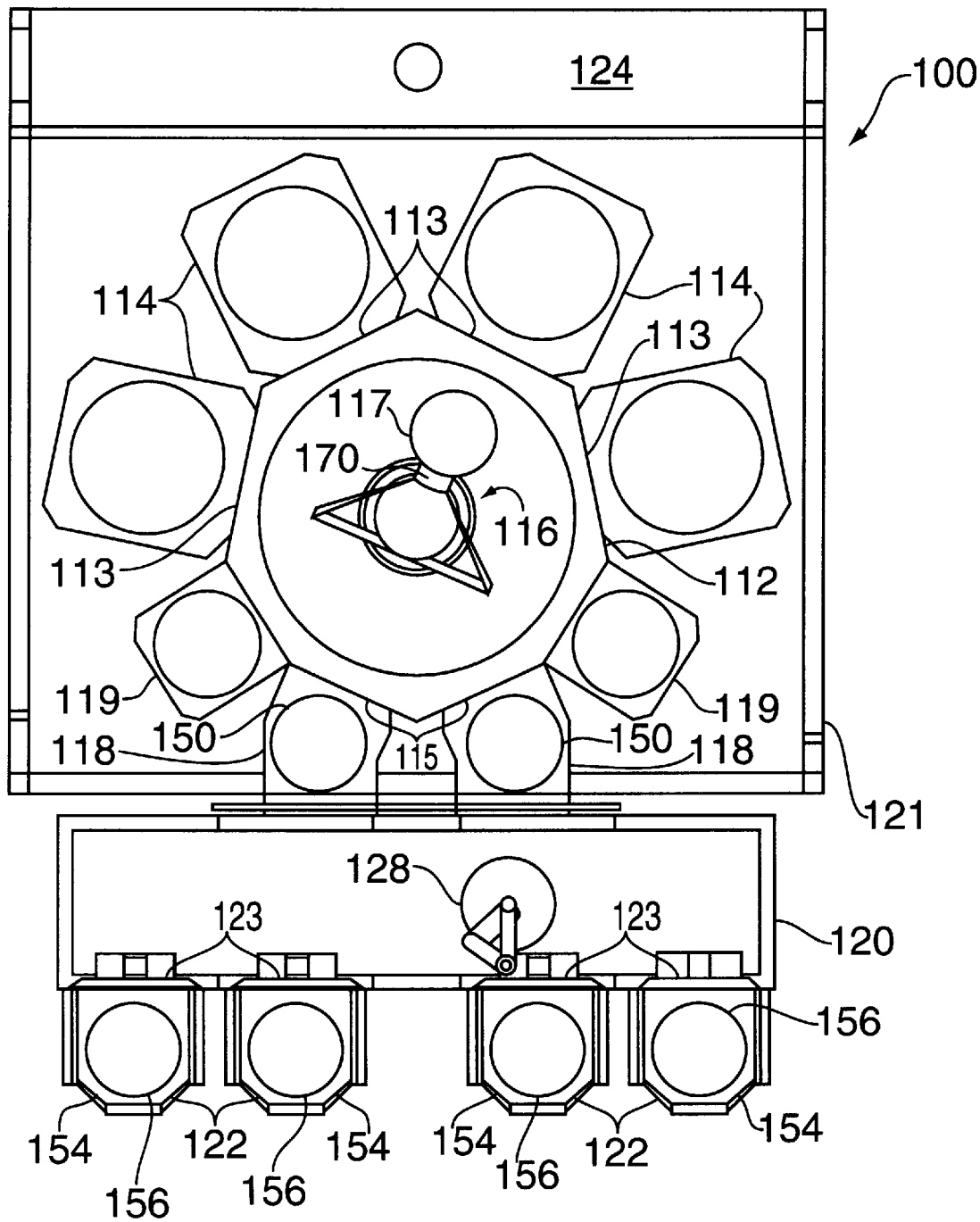
FIG. 2 is a top schematic view of a vacuum processing system.
Figure 3:
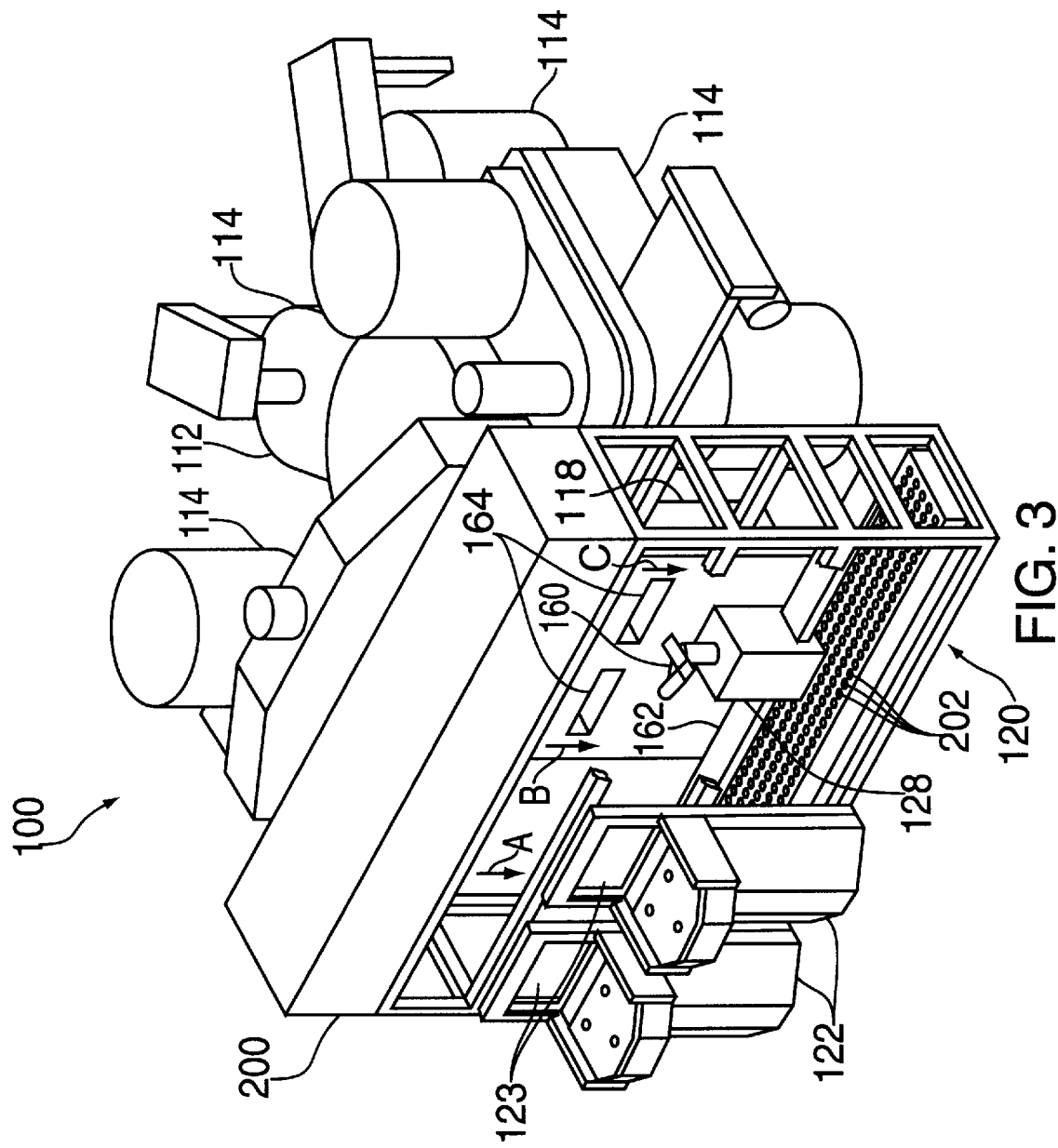
FIG. 3 is a perspective view of a simplified vacuum processing system showing the interior of a mini-environment.

FIGS. 2 and 3 show two views of a simplified embodiment of a vacuum processing system 100 of the present invention. The vacuum processing system 100 and its function will be described in detail below. Generally, the vacuum processing system 100 includes a transfer chamber 112, one or more process chambers 114, one or more load lock chambers 118, one or more expansion or cool-down chambers 119, a platform frame 121, a gas panel 124 and an optional substrate handling module 120, referred to herein as the mini-environment 120. The transfer chamber 112 and process chambers 114 define a processing environment wherein substrates are processed. The mini-environment 120 is a small space through which substrates are passed from substrate cassettes 154 seated on the load ports 122 to substrate holders in the load lock chambers 118 for subsequent transfer through the transfer chamber 112 to one or more of the processing chambers 114 for processing to form circuits or other structures on the substrates. A clean-air supply system 200 with one or more turbo-axial fans, described below, is disposed on the top of the mini-environment 120 for filtering air and flowing it through the mini-environment 120 to purge the air within the mini-environment to keep the mini-environment 120 clean. A substrate handler, or robot, 128 extends its arm assembly 160 through a pod door 123 to remove a substrate 156 from a load port 122, travels on a track 162 to position itself in front of a load lock chamber door 164, and extends its arm assembly 160 through a load lock chamber door 164 to insert the substrate into the load lock chamber 118 to the position of substrate 150. The substrate handler 128 reverses these movements to place a substrate back on a load port 122.

The circuits or other structures that the processing system 100 builds on the substrates are highly susceptible to damage or malfunction by contaminating particles that may land on the surface of a substrate at any time during the handling or processing of the substrates. Such particles may enter the fabrication area through the air ventilation system or be generated within the fabrication system by the movement of almost any kind of object, particularly movements of one object against another which may rub particles off of either object. Therefore, the environments through which the substrates are passed must be constantly cleaned of these particles. Specifically, the air through which the substrates may pass in ambient environments must be constantly flowed and filtered to remove any airborne particles.

Generally, the space in which the processing system 100 sits is divided into two areas by a wall (not shown) between the load lock chambers 118 and the mini-environment 120. Since the substrates are typically moved through the ambient air to the mini-environment 120, the air in the area on the mini-environment side of the wall, referred to as the white area, must be maintained very clean. After the substrates pass through the load lock chambers 118, the substrates enter a tightly sealed and highly controlled vacuum environment in the transfer chamber 112, the process chambers 114 and the load lock chambers 118, wherein they are generally protected from contaminating particles. Therefore, the area on the transfer chamber side of the wall, referred to as the gray area, does not need to be kept as clean as the white area, since the ambient air in this area does not come in contact with product substrates. The gray area does need to be kept fairly clean, though, to prevent contamination of the vacuum environment whenever one of the chambers 112, 114, 118, 119 is opened for inspection, service or repair.

Since human operators and factory automation machines move through the white area, potentially generating airborne particles, the mini-environment 120 provides a small confined space wherein the air cleanliness can be very rigorously controlled to permit the substrates to pass therethrough into the load lock chambers 118. Any airborne particles in the mini-environment 120 may be removed from the mini-environment 120 by purging the air in the mini-environment 120 with an airflow flowing downward in the direction of arrows A–C from the clean-air supply system 200 disposed on the top of the mini-environment 120.

The clean-air supply system 200 has a set of turbo-axial fans, or axial fans, for moving air through a high efficiency particle filter to remove airborne particles from the airflow before the particles enter the mini-environment 120. Additionally, the airflow quickly removes from the mini-environment 120 any airborne particles that managed to enter therein. The air flows out of the mini-environment 120 through air vents 202 in the bottom of the mini-environment 120.

Figure 4:
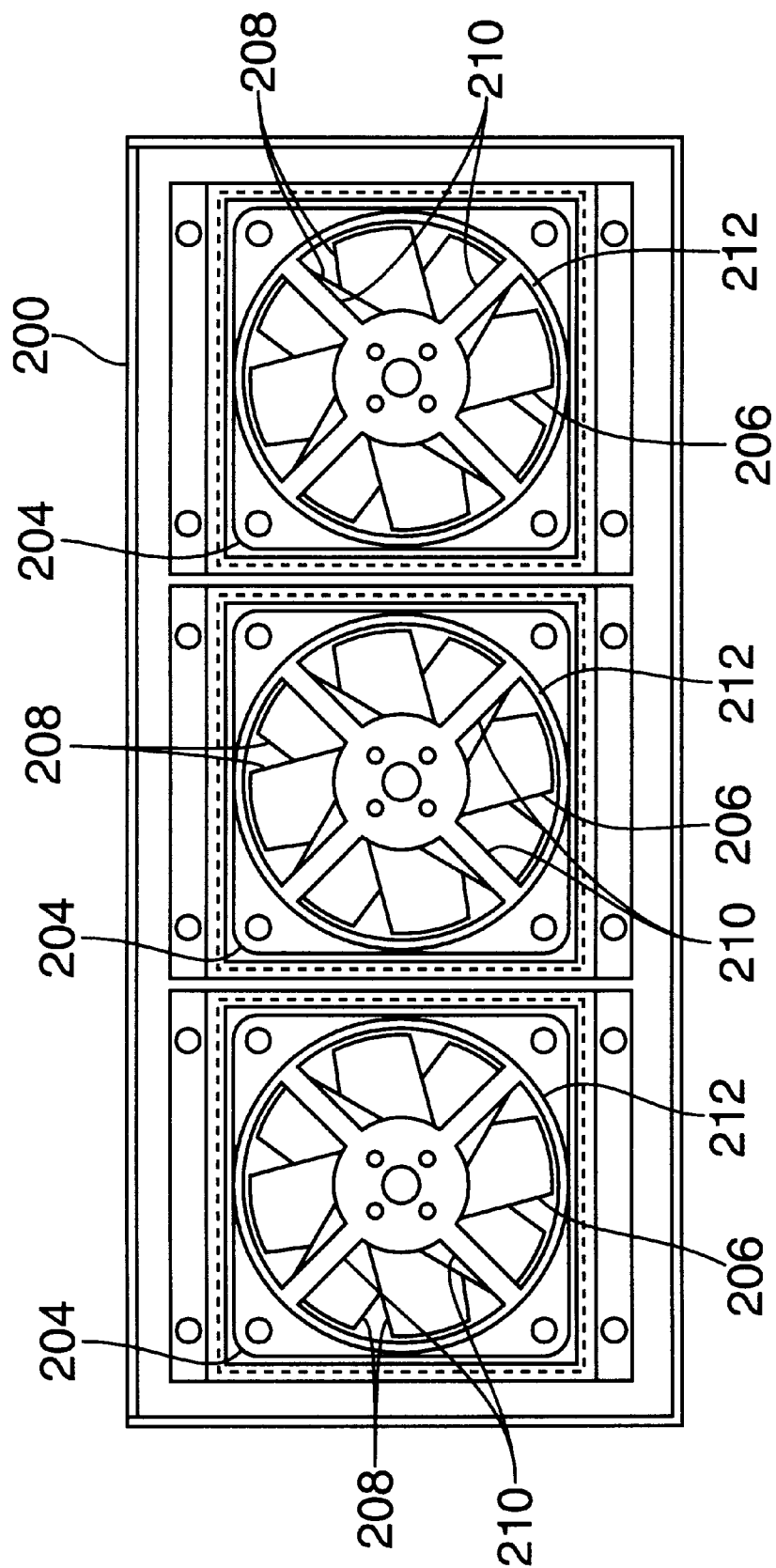
FIG. 4 is a top view of a clean-air supply system having a series of turbo-axial fan assemblies.

FIG. 4 shows a top view of an exemplary arrangement of turbo-axial fan assemblies 204 for a clean-air supply system 200 for a mini-environment 120. Each fan assembly 204 has a rotatable fan 206 with multiple fan blades, or vanes, 208 for forcing air to flow through the filter and into the mini-environment 120. The fans 206 mount to central motor housings 218 (see FIGS. 5–7) containing motors (not shown) for providing a rotational force to the fans 206. The central motor housings 218 mount to multiple support braces 210 which connect to fan housings 212 for containing the fan assemblies 204. The fan assemblies 204 mount to support braces (not shown) disposed in the clean-air supply system 200. The clean-air supply system 200 mounts to the top of the mini-environment 120 by suitable fasteners (not shown) around the periphery of the mini-environment 120.

Figure 5:
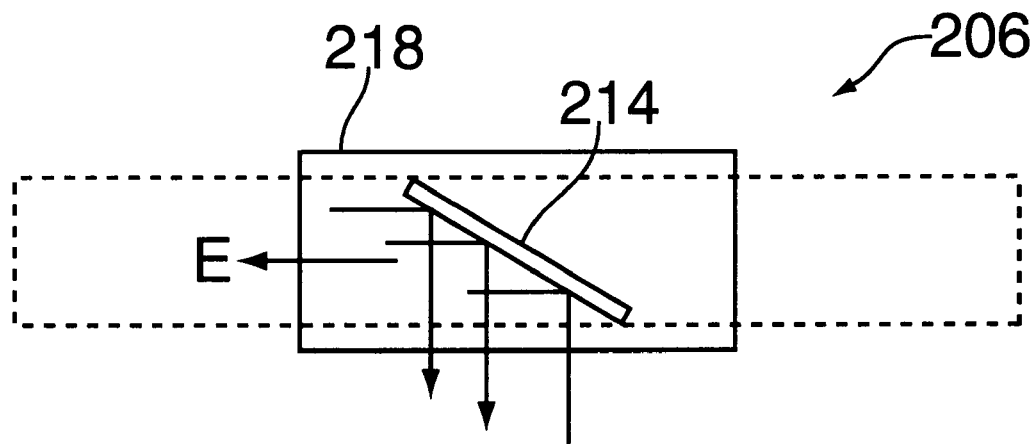
FIGS. 5–7 are side views of a simplified turbo-axial fan having adjustable vanes with the vanes at different pitch angles.
Figure 6:
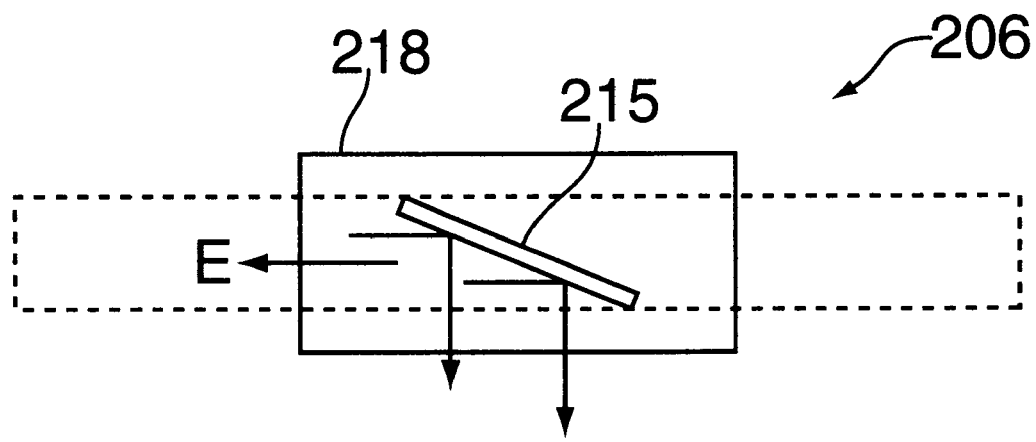
Figure 7:
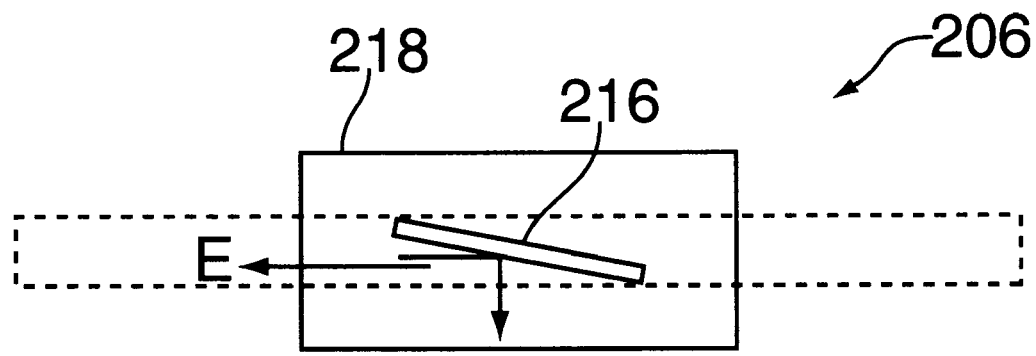

Variable-pitch, or tunable, turbo-axial fans are generally known. FIGS. 5 to 7 show three exemplary side views of a typical turbo-axial fan 206 having multiple fan blades 214–216 for generating air movement within the mini-environment 120 at three different purge rates. The fan blades 214–216 attach to the central motor housing 218, so the motors can rotate the fan blades 214–216 in the direction of arrows E at about the same axial speed, i.e., rotational speed for all three examples. Each view of fan 206 is shown with the fan blades 214–216 at a different pitch to illustrate the variable-pitch characteristics. Fan blade 214 is shown at a high pitch, so the fan 206 in FIG. 5 can move air at a high airflow rate. Fan blade 215 is shown at a medium pitch, so the fan 206 in FIG. 6 can move air at an intermediate airflow rate. Fan blade 216 is shown at a low pitch, so the fan 206 in FIG. 7 can move air at a low airflow rate.

The high blade pitch shown in FIG. 5 is used to generate a high airflow rate at times when the air inside the mini-environment 120 needs to be flushed out quickly to remove any particles that may have built up inside the mini-environment 120 or when a positive air pressure needs to be created inside the mini-environment 120, such as when a pod door 123 is opened, to keep contaminated air from entering the mini-environment 120. The medium blade pitch shown in FIG. 6 is used to generate a medium airflow rate, such as when substrates are being moved through the mini-environment 120 and the cleanliness of the air therein needs to be maintained at a high level, but a very high airflow rate is unnecessary. The low blade pitch shown in FIG. 7 is used to generate a low airflow rate when there is little or no activity inside the mini-environment 120 which can cause particles to enter the mini-environment 120 or to dislodge from surfaces inside the mini-environment 120, such as during a standby or idle condition of the system 100.

In the preferred embodiment, the fan 206 rotates at about the same axial speed in each example, but the examples in FIGS. 5–7 show a different vane pitch and move a different volume of air. Therefore, a different amount of power is required to operate the fan 206 in each example. If more than one fan is used in a clean-air supply system, then the fans typically operate at the same speed and vane pitch. Since the fan 206 shown in FIG. 5 moves the greatest amount of air, it has the largest load and the largest power requirements. Since the fan 206 shown in FIG. 7, on the other hand, moves the least amount of air, it has the lowest load and the lowest power requirements. The fan shown in FIG. 6 has and intermediate load an intermediate power requirement. Since the fan 206 in each example rotates at the same axial speed, although each fan 206 consumes a different amount of power, the fan 206 always utilizes its available power with the same efficiency, so no energy is wasted, and the fan assembly 204 can properly conserve energy at the lower loads. Additionally, since the fan 206 in each example rotates at the same axial speed, the EM emissions characteristics of the fan 206 do not change, so the fan 206 may be designed to meet EM emissions standards of all relevant countries or regions at just one axial speed.

In the event that one of the fans 206 in FIG. 4 fails to rotate properly, then the positive air pressure created by the other fans 206 may cause air to back-flow out through the fan housing 212 of the failed fan 206. Therefore, an alternative embodiment may include adjacent each fan 206 a flap or check valve that may be closed to prevent this back-flow of air.

THE SYSTEM

Referring back to FIGS. 2 and 3, an exemplary vacuum processing system 100 incorporating the above clean-air supply system will now be described in detail. The process chambers 114 perform the substrate process on the substrates in the vacuum processing system 100. The process chambers 114 may be any type of process chamber, such as a rapid thermal processing chamber, a physical vapor deposition chamber, a chemical vapor deposition chamber, an etch chamber, etc. The process chambers 114 may be supported by the transfer chamber 112 or may be supported on their own platforms depending on the configuration of the individual process chambers 114. Slit valves (not shown) in the facets 113 provide access for a substrate handler 116 to insert and remove substrates and provide isolation between the transfer chamber 112 and the process chambers 114. Correspondingly, the process chambers 114 have openings (not shown) on their surfaces that align with the slit valves.

The load lock chambers 118 support the substrates 150 on a set of substrate supports and transition the substrates 150 between the ambient environment pressure in the mini-environment 120 to the transfer chamber vacuum pressure. Openings (not shown) in facets 115 provide access and valves provide isolation between the load lock chambers 118 and the transfer chamber 112. Correspondingly, the load lock chambers 118 have openings on their surfaces that align with the openings in the facets 115. The load lock chambers 118 and the mini-environment 120 have corresponding openings 164 providing access therebetween, while doors (not shown) for the openings provide isolation.

The mini-environment 120 has four load ports 122 attached on its front side. The view shown in FIG. 3 has two of the load ports 122 removed in order to show the interior of the mini-environment 120. Openings with corresponding doors 123 provide access and isolation between the mini-environment 120 and the load ports 122. The load ports 122 are mounted on the side of the mini-environment 120 and are essentially shelves for supporting the substrates 156 in their substrate pods 154, which are used to transport the substrates 156 to and from the vacuum processing system 100.

The substrate handler 128 is disposed within the mini-environment 120 for transferring the substrates between the load ports 122 and the load lock chambers 118. The substrate handler 128 is typically mounted on a track 162 so the substrate handler 128 can move back and forth in the mini-environment 120 to service any load lock chamber 118 or load port 122.

In operation, the clean-air supply system 200 is turned on to flush out the mini-environment 120 of any accumulated particles. A substrate pod 154 containing substrates 156 to be processed in the processing system 100 is loaded onto one of the load ports 122. The door 123 to the load port 122 is opened. Typically, the substrate pod 154 forms a seal with the opening to the mini-environment 120 so as to prevent contaminated air from entering the mini-environment 120, but the clean-air supply system 200 may nevertheless be operated at a high airflow rate to ensure that there is a positive pressure inside the mini-environment 120, so no external air can leak into the mini-environment 120, until the operator is certain that there is no leak. The substrate handler 128 moves the substrates 156 from the substrate pod 154, through the mini-environment 120 and into one of the load lock chambers 118, while the clean-air supply system 200 operates at an intermediate airflow rate, until the load lock chamber is full of substrates 150. The load lock chamber 118 transitions the substrates 150 to the vacuum level of the transfer chamber 112. The transfer chamber substrate handler 116 transfers the substrates to one or more process chambers 114, so the process chambers 114 can process each substrate 117. After processing, the substrate handler 116 transfers the substrate 117 from the process chamber 114 to the load lock chamber 118. After the load lock chamber 118 returns the substrates to the pressure level of the ambient environment, the mini-environment substrate handler 128 transfers the substrates to the substrate pod 154. After the substrate pod 154 is full of processed substrates, the substrate pod 154 is removed and another substrate pod 154 containing substrates 156 to be processed in the processing system 100 is loaded onto the load port 122. If there are no more substrates to be processed, then the clean-air supply system 200 may be placed in a low-airflow state using a small amount of power until a new substrate pod 154 is loaded onto a load port 122.

While the foregoing is directed to the preferred embodiment of the present invention, other and further embodiments of the invention may be devised without departing from the basic scope thereof, and the scope thereof is determined by the claims which follow.

What is claimed is:

1. A module for use in a vacuum processing system, comprising:
    an enclosure of a vacuum processing system, the enclosure having an interior space;
    a clean-air supply system disposed proximate to the interior space; and
    at least one turbo-axial fan disposed within the clean-air supply system that generates an airflow through the interior space, the fan having an axis of rotation at an angle to a movement path of substrates through the enclosure.

2. The module of claim 1 wherein the at least one turbo-axial fan includes tunable vanes.

3. The module of claim 2 wherein the tunable vanes are adjustable to a range of airflow rates.

4. The module of claim 3 wherein the at least one turbo-axial fan is adapted to rotate at substantially the same axial speed at different airflow rates.

5. The module of claim 1 further comprising three turbo-axial fans disposed within the clean-air supply system.

6. A clean-air supply system comprising at least one turbo-axial fan that generates an airflow through an interior space of a module of a vacuum processing system the fan having an axis of rotation at an angle to a movement path of substrates through the interior space.

7. The clean-air supply system of claim 6 wherein the at least one turbo-axial fan includes tunable vanes.

8. The clean-air supply system of claim 7 wherein the tunable vanes are adjustable to a range of airflow rates.

9. The clean-air supply system of claim 8 wherein the at least one turbo-axial fan is adapted to rotate at substantially the same axial speed at different airflow rates.

10. The clean-air supply system of claim 6 further comprising three turbo-axial fans disposed within the clean-air supply system.

11. A vacuum processing system comprising:
    a substrate processing environment;
    a module cooperatively engaged with the processing environment and having an enclosure with an interior space;
    a clean-air supply system attached to the module that provides a filtered airflow through the interior space;
    a particle filter disposed within the clean-air supply system; and
    at least one turbo-axial fan disposed within the clean-air supply system that generates the airflow through the filter and the module, the fan having an axis of rotation at an angle to a movement path of substrates through the enclosure.

12. The vacuum processing system of claim 11 wherein the at least one turbo-axial fan includes tunable vanes.

13. The vacuum processing system of claim 12 wherein the tunable vanes are adjustable to a range of airflow rates.

14. The vacuum processing system of claim 13 wherein the at least one turbo-axial fan is adapted to rotate at substantially the same axial speed at different airflow rates.

15. The vacuum processing system of claim 11 further comprising three turbo-axial fans disposed within the clean-air supply system.

* * * * *